US009224846B2

(12) United States Patent
Shin et al.

(10) Patent No.: US 9,224,846 B2
(45) Date of Patent: Dec. 29, 2015

(54) NITRIDE SEMICONDUCTOR DEVICE AND FABRICATING METHOD THEREOF

(71) Applicant: LG ELECTRONICS INC., Seoul (KR)

(72) Inventors: Jonghoon Shin, Seoul (KR); Woongsun Kim, Seoul (KR); Taehoon Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/251,717

(22) Filed: Apr. 14, 2014

(65) Prior Publication Data

US 2014/0306181 A1 Oct. 16, 2014

(30) Foreign Application Priority Data

Apr. 16, 2013 (KR) .......................... 10-2013-0041813

(51) Int. Cl.
| | | |
|---|---|---|
| *H01L 21/338* | (2006.01) | |
| *H01L 29/778* | (2006.01) | |
| *H01L 29/66* | (2006.01) | |
| *H01L 21/02* | (2006.01) | |
| *H01L 29/20* | (2006.01) | |

(52) U.S. Cl.
CPC ...... *H01L 29/7783* (2013.01); *H01L 21/02241* (2013.01); *H01L 29/66462* (2013.01); *H01L 29/7787* (2013.01); *H01L 29/2003* (2013.01)

(58) Field of Classification Search
USPC ........... 257/192, E29.242, E21.158, E29.089, 257/20, 615, 94, 103, 79, 2; 438/172, 191, 438/285, 438, 47, 510, 606
See application file for complete search history.

(56) References Cited

U.S. PATENT DOCUMENTS

| | | | | |
|---|---|---|---|---|
| 7,576,373 | B1* | 8/2009 | Hikita et al. ................... | 257/192 |
| 7,759,710 | B1* | 7/2010 | Chiu ..................... | A61B 5/1473 |
| | | | | 257/253 |
| 8,603,880 | B2* | 12/2013 | Yamada ........................ | 438/285 |
| 2010/0097105 | A1 | 4/2010 | Morita et al. | |
| 2011/0147704 | A1* | 6/2011 | Jiang et al. ....................... | 257/13 |
| 2012/0211760 | A1* | 8/2012 | Yamada ........................... | 257/76 |

FOREIGN PATENT DOCUMENTS

| | | |
|---|---|---|
| JP | 08-153871 | 6/1996 |
| JP | 09-199452 | 7/1997 |
| WO | 2008062800 A1 | 5/2008 |

OTHER PUBLICATIONS

"Effect of Thermal Annealing on the GaN Metal-Oxide Semiconductor Capacitors with Gallium Oxide Gate Layer" Ming-Lun Lee, Journal of Electrochemical Society, 2010.

\* cited by examiner

*Primary Examiner* — Telly Green
(74) *Attorney, Agent, or Firm* — Dentons US LLP

(57) ABSTRACT

This specification relates to an enhancement-type semiconductor device having a passivation layer formed using a photoelectrochemical (PEC) method, and a fabricating method thereof.
To this end, a semiconductor device according to one exemplary embodiment includes a GaN layer, an AlGaN layer formed on the GaN layer, a p-GaN layer formed on the AlGaN layer, a gate electrode formed on the p-GaN layer, a source electrode and a drain electrode formed on a partial region of the AlGaN layer, and a passivation layer formed on a partial region of the AlGaN layer, the passivation layer formed between the source electrode and the gate electrode or between the gate electrode and the drain electrode, wherein the passivation layer is formed in a manner of oxidizing a part of the p-GaN layer.

6 Claims, 7 Drawing Sheets

(a)

(b)

(c)

(d)

(e)

NITRIDE SEMICONDUCTOR DEVICE AND FABRICATING METHOD THEREOF

CROSS-REFERENCE TO RELATED APPLICATION

Pursuant to 35 U.S.C. §119(a), this application claims the benefit of earlier filing date and right of priority to Korean Application No. 10-2013-0041813, filed on Apr. 16, 2013, the contents of which is incorporated by reference herein in its entirety.

BACKGROUND OF THE DISCLOSURE

1. Field of the Disclosure

This specification relates to an enhancement-type nitride semiconductor device having a passivation layer formed using a photoelectrochemical (PEC) method, and a fabricating method thereof.

2. Background of the Disclosure

A nitride semiconductor exhibits several advantages including high threshold electric field, low On-resistance, high temperature, and high frequency applications. The spotlight to the nitride semiconductor comes from those advantages, and advanced researches on the nitride semiconductor as a material for the next generation semiconductor device are conducted.

In recent time, mainstream high power devices include MOSFET and IGBT, and also devices such as GaN-based HEMT, HFET, MOSFET and the like are studied.

The HEMT which uses high electron mobility is employed for communication devices exhibiting high frequency performance.

Also, the HEMT is used in power semiconductors, communication devices showing high frequency performance, and the like. In recent time, developments of hybrid/fuel cell cars are ongoing, and various overseas corporations are releasing hybrid vehicles. Reliable operations at high temperature are required for semiconductor switches, which are disposed within voltage booster converter and inverter for connecting a motor to a generator within a hybrid vehicle, due to heat generated from an engine. Gallium nitride (GaN) may allow for the reliable operations at the high temperature owing to its wide bandgap, so as to be proper as the next generation semiconductor switch within hybrid cars.

Among others, Furukawa Electrics in Japan has issued an AlGaN/GaN high-electron-mobility transistor (HEMT) discrete, which has a high breakdown voltage of 750V and a low On-resistance of 6.3 mΩ-cm2. It has thusly been proved that the HEMT has superior characteristics to the conventional Si MOSFET, Si superjunction MOSFET and SiC MOSFET. Also, the issued GaN discrete has shown a stable switching operation at a high temperature of 225.

FIG. 1 is an exemplary view showing a general structure of Heterojunction Field Effect Transistor (HFET).

As shown in FIG. 1, a general HFET 10 may switch a 2 DEG current, which flows from a drain electrode to a source electrode, through a schottky gate electrode.

The general HFET 10 may include a substrate (not illustrated), a first GaN layer 11 formed on the substrate, an AlGaN layer 12 on the first GaN layer 11, a second GaN layer 13 on the AlGaN layer 12, and a gate electrode 14, a source electrode 15 and a drain electrode 16 all formed on the second GaN layer 13.

Many attempts have been made to use this type of HFET device as a high-output power device, by virtue of excellent voltage and current characteristics of the HFET device. However, the HFET device may have a disadvantage in that it is a normally-on type device, unlike other devices such as MOSFET, IGBT and the like.

Since the normally-on device is difficult to be produced due to high complexity in constructing a circuit, several methods, such as plasma processing, p-GaN growth, gate recess and the like, are on the course of the studies, as a way for increasing a threshold voltage.

SUMMARY OF THE DISCLOSURE

Therefore, an aspect of the detailed description is to provide an enhancement-type nitride semiconductor device having a passivation layer formed is using photoelectrochemistry, and a fabricating method thereof.

To achieve these and other advantages and in accordance with the purpose of this specification, as embodied and broadly described herein, there is provided a semiconductor device including, a GaN layer, an AlGaN layer formed on the GaN layer, a p-GaN layer formed on the AlGaN layer, a gate electrode formed on the p-GaN layer, a source electrode and a drain electrode formed on a partial region of the AlGaN layer, and a passivation layer formed on a partial region of the AlGaN layer, the passivation layer formed between the source electrode and the gate electrode or between the gate electrode and the drain electrode, wherein the passivation layer may be formed in a manner of oxidizing a part of the p-GaN layer.

In accordance with one exemplary embodiment disclosed herein, the passivation layer may be formed by oxidizing the p-GaN layer based on a photoelectrochemical (PEC) method.

In accordance with one exemplary embodiment disclosed herein, the passivation layer may be formed of $GaO_x$, and x may range from 0.1 to 2.0.

In accordance with one exemplary embodiment disclosed herein, the p-GaN layer may be doped with a p-type dopant, and the p-type dopant may be at least one of Mg and Zn.

In accordance with one exemplary embodiment disclosed herein, the p-type dopant may have a concentration in the range of 1e12/cm3~1e21/cm3.

In accordance with one exemplary embodiment disclosed herein, the p-GaN layer may have a thickness in the range of 1 nm to 1 um.

In accordance with one exemplary embodiment disclosed herein, the GaN layer may have a thickness in the range of 0.5 um to 7 um.

In accordance with one exemplary embodiment disclosed herein, the GaN layer may be doped with at least one dopant of Mg, C and Fe, and the at least one dopant may have a concentration in the range of 1e16/cm3~5e20/cm3.

In accordance with one exemplary embodiment disclosed herein, the AlGaN layer may have a thickness in the range of 2 nm to 100 nm.

In accordance with one exemplary embodiment disclosed herein, the semiconductor device may further include a GaN cap layer formed on the AlGaN layer.

In accordance with one exemplary embodiment disclosed herein, the GaN cap layer may have a thickness in the range of 2 nm to 10 nm.

In accordance with one exemplary embodiment disclosed herein, the GaN layer may be formed on a buffer layer.

In accordance with one exemplary embodiment disclosed herein, the buffer layer may be formed of AlN, AlGaN and a AlN structure.

In accordance with one exemplary embodiment disclosed herein, the buffer layer may be formed on the substrate.

In accordance with one exemplary embodiment disclosed herein, the substrate may be made of at least one of Si, SiC, sapphire and GaN.

To achieve these and other advantages and in accordance with the purpose of this specification, as embodied and broadly described herein, there is provided a method for fabricating a semiconductor device, including forming a buffer layer on a substrate, forming a GaN layer on the buffer layer, forming an AlGaN layer on the GaN layer, forming a p-GaN layer on the AlGaN layer, forming a source electrode and a drain electrode, spaced from each other, on the AlGaN layer, which has been open by etching a part of the p-GaN layer, forming a is passivation layer in a manner of oxidizing the p-GaN layer, except for a partial region for forming a gate electrode thereon, and forming a gate electrode on the partial region of the p-GaN layer for forming the gate electrode thereon.

In accordance with one exemplary embodiment disclosed herein, at least one of the buffer layer, the GaN layer, the AlGaN layer and the p-GaN layer may be formed based on at least one of metal organic chemical vapor deposition (MOCVD), molecular beam epitaxy (MBE), hydride vapor phase epitaxy (HYPE), plasma-enhanced chemical vapor deposition (PECVD), sputtering, and atomic layer deposition (ALD).

In accordance with another exemplary embodiment to achieve these and other advantages and in accordance with the purpose of this specification, as embodied and broadly described herein, there is provided a method for fabricating a semiconductor device including forming a buffer layer on a substrate, forming a GaN layer on the buffer layer, forming an AlGaN layer on the GaN layer, forming a p-GaN layer on the AlGaN layer, forming a passivation layer by oxidizing the p-GaN layer, except for a partial region for forming a gate electrode thereon, forming a source electrode and a drain electrode, spaced from each other, on the AlGaN layer, which has been open by etching a part of the passivation layer, and forming a gate electrode on the partial region of the p-GaN layer for forming the gate electrode thereon.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the is disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Figure 1:
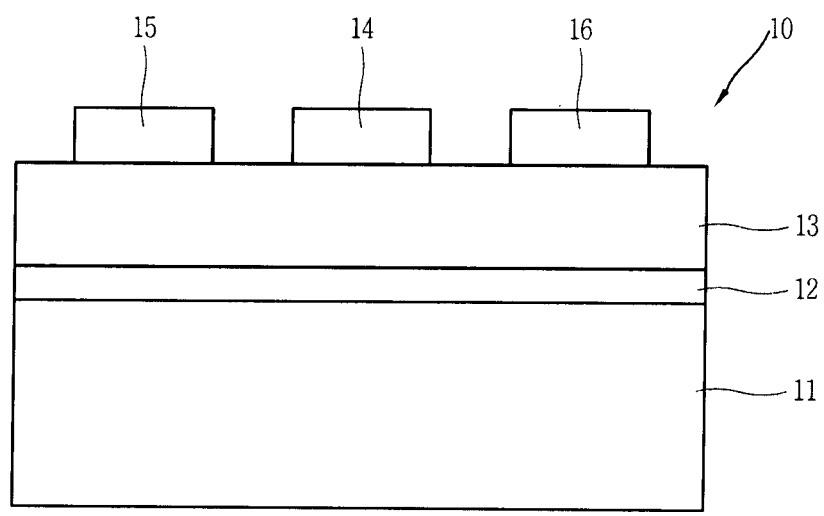
FIG. 1 is an exemplary view of a general structure of HFET.

The technology disclosed herein may be applied to a Heterojunction Field Effect Transistor (HFET) and a fabricating method thereof. The technology disclosed herein is not limited to this, and may also be applicable to all kinds of application fields of nitride semiconductors and fabricating methods thereof to which the technological spirit of the technology can be applied.

The technology disclosed herein relates to an enhancement-type nitride semiconductor device having a passivation layer formed using a photoelectrochemical (PEC) method, and a fabricating method thereof.

Specifically, the technology disclosed herein relates to an enhancement type nitride semiconductor device having a passivation layer formed using a photoelectrochemical (PEC) method, and a fabricating method thereof, and more particularly, a semiconductor device having a structure, in which a conventional passivation layer and an etching technique have been improved, in a manner of forming a passivation layer on an enhancement-type nitride semiconductor, which exhibits normally-off switching and high current characteristic, through the PEC method, and a fabricating method thereof.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

Description of Method of Forming General Passivation Layer

A nitride semiconductor has a high threshold electric field and a high saturated electron mobility, and thus a semiconductor device fabricated using the nitride semiconductor may exhibit a high breakdown voltage and a high current characteristic.

One example may be an HFET device which is fabricated based on a heterojunction structure.

In accordance with one exemplary embodiment, as a technology which can maintain a high current characteristic of the nitride semiconductor device and simultaneously execute normally-off switching, there may be a p-GaN gate.

The p-GaN gate technology may be configured in a manner of growing a GaN, which is doped with a p-type dopant, on an AlGaN/GaN heterojunction structure, and forming a gate electrode on the GaN.

The formed p-GaN layer may serve to deplete two-dimensional free electron gas (2DEG) which is present on an interface between AlGaN and GaN.

In accordance with one exemplary embodiment disclosed herein, in order to improve quality of the nitride semiconductor device and protect the device, a passivation layer may further be formed on the structure which has the p-GaN and the gate electrode on the p-GaN.

Figure 2:
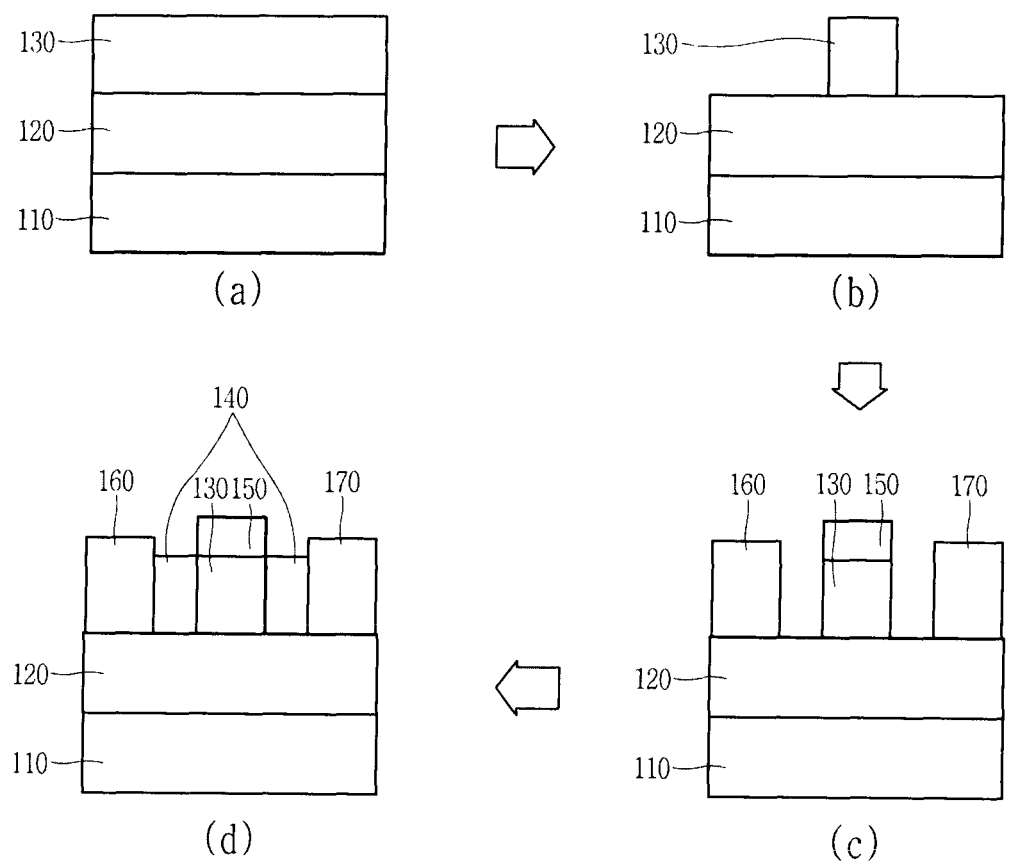
FIG. 2 is an exemplary view of a method of forming a general passivation layer.

FIG. 2 is an exemplary view of a general method of forming a passivation layer.

As illustrated in FIG. 2, in generally, a part (or a partial region) of a p-GaN layer 130 may be etched, except for a gate portion, from a wafer including a structure of p-GaN(130)/AlGaN(120)/GaN(110), to expose the AlGaN 120. A metal may be deposited on a surface of the exposed AlGaN 120 to form a source electrode 160, a gate electrode 150 and a drain electrode 170.

A deposition process may then be carried out to form a passivation layer 140 between the source electrode 160 and the p-GaN layer 130 and between the p-GaN layer 130 and the drain electrode 170.

When the p-GaN layer 130 is formed under the gate electrode 150, the p-GaN layer 130 and the lower AlGaN(120)/GaN(110) structure may form a p-n junction, and generate depletion.

Hence, a 2DEG layer may disappear from a lower end of the gate electrode. Consequently, when the gate is grounded, a current may not flow between the source and drain electrodes.

However, when a threshold voltage having a plus (+) sign is applied to the gate, the 2DEC layer which has disappeared from the lower end of the gate may appear again. Accordingly, a current may flow again and then a switching operation may be enabled.

That is, upon using the p-GaN gate, a normally-off operation of the nitride semiconductor device may be allowed and simultaneously a high current characteristic can be maintained.

However, in the general method of forming the passivation layer, the p-GaN etching and the passivation layer deposition of the aforementioned processes should be carried out very precisely.

That is, for the p-GaN etching, when the p-GaN layer is etched deep, the AlGaN layer may be thin in thickness. This may reduce an amount of 2DEG and thereby reduce an amount of current which may flow in an on-state.

On the other hand, when the p-GaN layer remains still due to a shallow etched depth of the p-GaN layer, if the p-GaN layer is present on a lower end of the source electrode or a lower end of the drain electrode, an ohmic junction between the metal and the semiconductor may not be allowed. Consequently, a current may not flow well.

Also, when the p-GaN layer is left between the source electrode and the gate electrode or between the gate electrode and the drain electrode, a leakage current which is generated in an off-state may increase.

Therefore, a technique of etching the p-GaN by an exact amount may be required.

However, with regard to a typically used dry-etching method, it spends a short etching time in a unit of several tens of seconds. Therefore, it may be difficult to implement an etching by a desired depth.

Meanwhile, the passivation layer may generally be formed by depositing oxide or nitride using a deposition tool.

However, when the deposition is carried out by using a sputter, atomic layer deposition (ALD), plasma-enhanced chemical vapor deposition (PECVD), CVD, metal organic chemical vapor deposition (MOCVD) or the like, foreign materials may be deposited on the AlGaN/GaN layer, which may bring about lowering of quality of an interface and quality of the passivation layer.

When the oxide or nitride has inferior quality, it may result in lowering of a switching characteristic of a device, a current characteristic in an on-state, and a leakage current characteristic in an off-state.

Therefore, there may be a demand of a technology which allows an accurate etching of the p-GaN layer for improving quality and ensuring a yield of the nitride semiconductor supporting the normally-off switching, and forms a passivation layer with high quality.

Hereinafter, a structure of a semiconductor device in accordance with one exemplary embodiment disclosed herein will be described with reference to FIGS. 3 and 4.

Description of Semiconductor Device According to One Exemplary Embodiment

A semiconductor device in accordance with one exemplary embodiment disclosed herein may include a GaN layer, an AlGaN layer formed on the GaN layer, a p-GaN layer formed on the AlGaN layer, a gate electrode formed on the p-GaN layer, a source electrode and a drain electrode formed on a partial region of the AlGaN layer, and a passivation layer formed on the partial region of the AlGaN layer and also formed between the source electrode and the gate electrode or between the gate electrode and the drain electrode.

Here, the passivation layer may be formed in a manner that the p-GaN layer is partially oxidized.

In accordance with one exemplary embodiment, the passivation layer may be formed in such a manner that the p-GaN layer is oxidized based on a photoelectrochemical (PEC) method.

Also, in accordance with one exemplary embodiment, the passivation layer may be made of GaOx. Here, x may range from 0.1 to 2.0.

In addition, according to one exemplary embodiment, the p-GaN layer may be doped with a p-type dopant, and the p-type dopant may be at least one of Mg and Zn.

In accordance with one exemplary embodiment, a concentration of the p-type dopant may be in the range of 1e12/cm3 to 1e21/cm3.

In accordance with one exemplary embodiment, the p-GaN layer may have a thickness in the range of 1 nm to 1 um.

In accordance with one exemplary embodiment, the GaN layer may have a thickness in the range of 0.5 um to 7 um.

In accordance with one exemplary embodiment, the GaN layer may be doped with at least one of Mg, C and Fe, and a concentration of the at least one dopant may be in the range of 1e16/cm3~5e20/cm3.

In accordance with one exemplary embodiment, the AlGaN layer may have a thickness in the range of 2 nm to 100 nm.

In accordance with one exemplary embodiment, the semiconductor device may further include a GaN cap layer formed on the AlGaN layer.

In accordance with one exemplary embodiment, the GaN cap layer may have a thickness in the range of 2 nm to 10 nm.

In accordance with one exemplary embodiment, the GaN layer may be formed on a buffer layer.

In accordance with one exemplary embodiment, the buffer layer may be formed of at least one of AlN, AlGaN and a superlattice structure.

In accordance with one exemplary embodiment, the buffer layer may be formed on a substrate.

In accordance with one exemplary embodiment, the substrate may be made of at least one of Si, SiC, sapphire and GaN.

Figure 3:
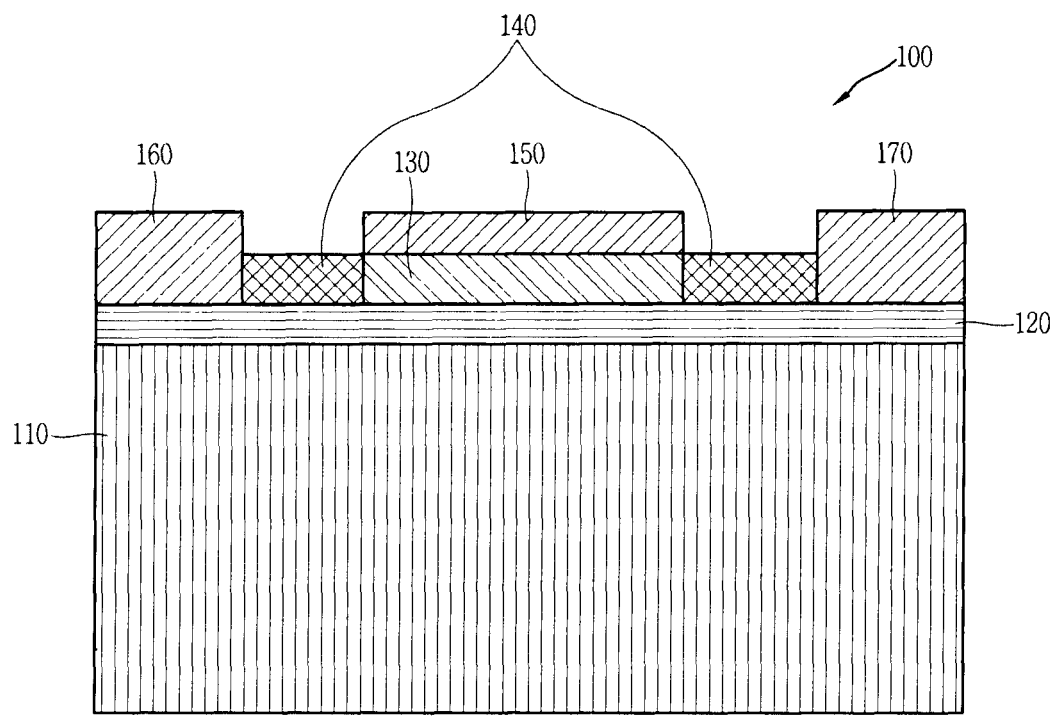
FIG. 3 is an exemplary view illustrating a structure of a semiconductor device in accordance with one exemplary embodiment disclosed herein.

FIG. 3 is an exemplary view illustrating a structure of a semiconductor device in accordance with one exemplary embodiment disclosed herein.

As illustrated in FIG. 3, a semiconductor device 100 according to one exemplary embodiment disclosed herein may include a GaN layer 110, an AlGaN layer 120, a p-GaN layer 130, a passivation layer 140, a gate electrode 150, a source electrode 160, and a drain electrode 170.

In accordance with one exemplary embodiment, the semiconductor device 100 may further include a buffer layer (not illustrated) located below the GaN layer 110.

In accordance with one exemplary embodiment, the semiconductor device 100 may further include a GaN cap layer (not illustrated).

The semiconductor device 100 according to the one exemplary embodiment may switch a 2DEG current, which flows from the drain electrode 170 to the source electrode 160, using a schottky gate electrode 700.

The buffer layer may be formed on a substrate (not illustrated).

In accordance with one exemplary embodiment, the substrate may be a n-type substrate or a p-type substrate, and may be formed of various types of materials. For example, the substrate may be at least one of an insulating substrate, a sapphire substrate, a GaN substrate, an SiC substrate, and an Si substrate. In addition to those, it may be obvious to those skilled in the art that various types of substrates can be applied to the semiconductor device disclosed herein Also, the substrate may be removed after fabrication of the semiconductor device 100. Therefore, the ultimate structure of the semiconductor device 100 may be a structure without the substrate.

The buffer layer may be made of various materials. For example, the buffer layer may be made of at least one of AlN and AlGaN.

In accordance with one exemplary embodiment, the buffer layer may include a superlattice buffer structure (or a superlattice layer).

In accordance with one exemplary embodiment, when the buffer layer is made of AlN, the buffer layer may be grown under various conditions. For example, the buffer layer may include a first AlN layer grown at low temperature, and a second AlN layer grown on the first AlN layer at high temperature.

In accordance with another exemplary embodiment, when the buffer layer is made of AlGaN, a composition ratio of Al may be changed along a deposition direction of the Al. For example, the buffer layer may be made of AlGaN in which a composition of Al is gradually reduced in a deposition direction.

That is, the Al composition of the AlGaN layer may be expressed as $Al_xGa_{1-x}N$ ($0 \le x \le 1$). For example, the composition of Al may be reduced in a continuous, gradual manner. Also, for example, the composition of Al may be gradually reduced in a stepwise manner.

Besides, it may be obvious to a skilled person in the art that the buffer layer can be formed based on various materials, composition ratios and growth conditions.

The buffer layer may be formed in various manners. For example, the buffer layer may be formed in a manner of selectively growing a nitride semiconductor crystal, especially, based on at least one of MOCVD, molecular beam epitaxy (MBE) and hydride vapor phase epitaxy (HYPE). Here, taking into account crystallinity of the buffer layer, the MOCVD method may be generally employed in device fabrication.

When the buffer layer includes the superlattice layer (not illustrated), the superlattice layer may be formed in a manner of depositing (laminating) a plurality of superlattice thin film pairs, which include two different thin films deposited on each other.

In other words, the superlattice layer may be formed by depositing two different thin films in an alternating manner.

The superlattice thin film may be made of various materials. For example, the superlattice thin film (pair) may be at least one of AlN/GaN, AlN/AlGaN and AlGaN/GaN. That is, each of the two different thin films may be made by a combination of at least one of AlN/GaN, AlN/AlGaN and AlGaN/GaN. It may be obvious to a skilled person in the art that other various materials may be used to form the superlattice thin film.

In accordance with one exemplary embodiment, the Al composition of the AlGaN layer may be expressed as $Al_xGa_{1-x}N$ ($0 \le x \le 1$), and the Al composition may be changed along a deposition direction. For example, the composition of Al may be reduced in a continuous, gradual manner. Also, for example, the composition of Al may be gradually reduced in a stepwise manner.

In accordance with one exemplary embodiment, each of the two different thin films may have a thickness in the range of 1 nm to 100 nm, more particularly (or preferably), in the range of 5 nm to 35 nm.

In accordance with one exemplary embodiment, the superlattice layer may include 3 to 500 superlattice thin films. In other words, the superlattice layer may include 3 to 500 pairs of the two different thin films. This may also mean that the superlattice layer may be formed by depositing the two different thin films in an alternating manner 5 to 999 times.

The superlattice layer may be formed in various manners. For example, the superlattice layer may be formed in a manner of selectively growing a nitride semiconductor crystal, especially, based on at least one of MOCVD, MBE and HYPE. Here, taking into account crystallinity of the superlattice layer, the MOCVD method may be generally employed in device fabrication.

In accordance with one exemplary embodiment, the superlattice buffer structure (or the superlattice layer) may be doped with a specific dopant.

In accordance with one exemplary embodiment, the specific dopant may be a p-type dopant. For example, the p-type dopant may be at least one of Mg, C and Fe.

In accordance with one exemplary embodiment, a concentration of the p-type dopant may be in the range of 1e16/cm3~5e20/cm3, preferably, in the range of 3e17/cm3~1e20/cm3.

In accordance with one exemplary embodiment, the concentration of the p-type dopant may be gradually reduced along the deposition direction of the superlattice layer. For example, the concentration of the p-type dopant may be reduced in a continuous, gradual manner. Also, for example, the concentration of the p-type dopant may be gradually reduced in a stepwise manner.

The GaN layer 110 may have a thickness in the range of 0.1 um to 100 um, preferably, in the range of 0.5 um to 7 um.

The GaN layer 110 may be formed in various manners. For example, the GaN layer 110 may be formed in a manner of selectively growing nitride semiconductor crystals, especially, based on at least one of MOCVD, MBE and HYPE. Here, taking into account crystallinity of the GaN layer 110, the MOCVD method may be generally employed in device fabrication.

In accordance with one exemplary embodiment, the semiconductor device 100 may further include a high-resistance GaN layer (not illustrated) for exhibiting a semi-insulating characteristic of a GaN channel, which is formed by injecting at least one dopant of C, Fe and Mg on the GaN layer 110. Here, a concentration of the at least one dopant may be in the range of 1e16/cm3~5e20/cm3, preferably, in the range of 3e17/cm3~1e20/cm3.

The AlGaN layer 120 may be formed on the GaN layer 110. The AlGaN layer 120 may serve as an active layer.

In accordance with one exemplary embodiment, the AlGaN layer 120 may have a thickness in the range of 0 nm to 100 nm, preferably, in the range of 10 nm to 30 nm.

The AlGaN layer 120 may be made of various materials and compositions. For example, the AlGaN layer 120 may be made of AlxGa1-xN. Here, x may range from 0.01 to 1. It may be obvious to a skilled person in the art that other various materials or composition ratios may be employed to form the AlGaN layer 120.

The AlGaN layer 120 may be formed in various manners. For example, the AlGaN layer may be formed in a manner of selectively growing nitride semiconductor crystals, especially, based on at least one of MOCVD, MBE and HYPE. Here, taking into account crystallinity of the AlGaN layer 120, the MOCVD method may be generally employed in device fabrication.

The GaN cap layer may be formed on the AlGaN layer 120, and formed in a manner of growing the GaN to be thin.

In accordance with one exemplary embodiment, the GaN cap layer may have a thickness in the range of 0 nm to 100 nm, preferably, in the range of 2 nm to 10 nm. The GaN cap layer may serve to block a surface leakage current.

The source electrode 160 and the drain electrode 170 may be formed on a partial region of the AlGaN layer 120. Also, when the semiconductor device 100 further includes the GaN cap layer, the source electrode 160 and the drain electrode 170 may be formed on a partial region of the GaN cap layer.

The p-GaN layer 130 may be formed on the AlGaN layer 120.

The p-GaN layer 130 may be doped with a p-type dopant, and the p-type dopant may be at least one of Mg and Zn.

In accordance with one exemplary embodiment, the concentration of the p-type dopant may be in the range of 1e12/cm3~1e21/cm3.

Also, in accordance with one exemplary embodiment, the p-GaN layer 130 may have a thickness in the range of 1 nm to 1 um.

The p-GaN layer 130 may be formed in various manners. For example, the p-GaN layer 130 may be formed in a manner of selectively growing nitride semiconductor crystals, especially, based on at least one of MOCVD, MBE and HYPE. Here, taking into account crystallinity of the p-GaN layer 130, the MOCVD method may be generally employed in device fabrication.

After the growth (or epitaxial-growth) of the p-GaN layer 130, an activation of the p-GaN layer 130 may be carried out to form a hole within the p-GaN layer 130.

The gate electrode 150 may be formed on the p-GaN layer 130.

As aforementioned, a 2DEG current, which flows from the drain electrode 170 to the source electrode 160, may be generated in a manner of controlling the gate electrode 150.

The passivation layer 140, as illustrated in FIG. 3, may be formed on a partial region of the AlGaN layer 120.

The passivation layer 140 may also be formed between the source electrode 160 and the gate electrode 150.

The passivation layer 140 may also be formed between the gate electrode 150 and the drain electrode 170.

In accordance with one exemplary embodiment, the passivation layer 140 may be formed in a manner that the p-GaN layer 130 is partially oxidized.

In accordance with one exemplary embodiment, the passivation layer 140 may be formed in a manner that the p-GaN layer 130 is oxidized by a PEC method.

The method of forming the passivation layer 140 using the PEC method will be described in detail with reference to FIG. 4.

Figure 4:
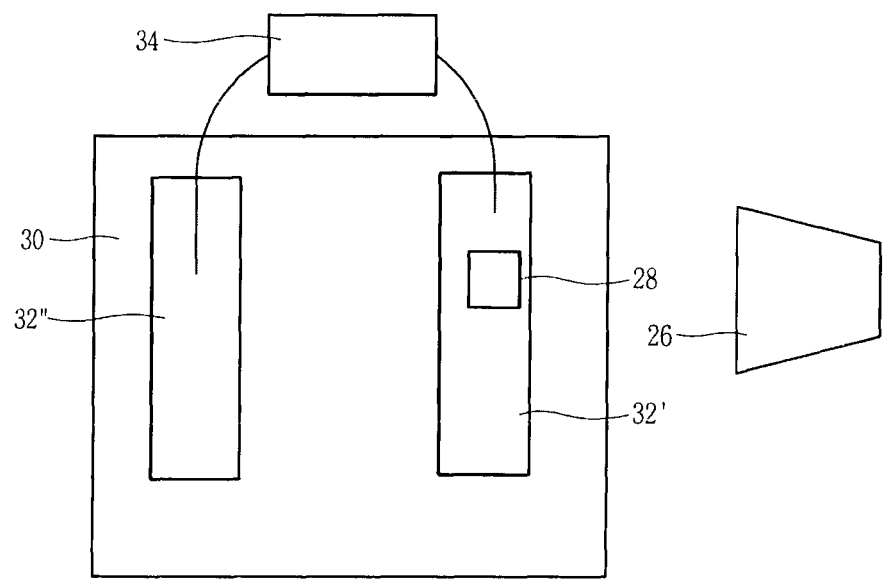
FIG. 4 is an exemplary view illustrating a photoelectrochemical (PEC) method for forming a passivation layer in accordance with one exemplary embodiment disclosed herein.

FIG. 4 is an exemplary view illustrating a photo-electrochemistry for forming the passivation layer in accordance with one exemplary embodiment disclosed herein.

As illustrated in FIG. 4, in order to construct an enhancement-type semiconductor device which is fabricated by the aforementioned method, the gate electrode, the source electrode and the drain electrode may be formed. Here, the passivation layer 140 may be formed among those electrodes through the PEC method.

A portion where the passivation layer is not desired to be formed may be processed to be shielded from a light source corresponding to a bandgap of the p-GaN or the AlGaN. Afterwards, as illustrated in FIG. 4, the p-GaN layer may be oxidized using the PEC method.

For example, the portion on which the passivation layer is not desired to be formed, may be a partial region of the p-GaN layer 130, on which the gate electrode 140 is formed.

The portion on which the passivation layer is not desired to be formed may be processed in a manner of coating a photoresistor (PR), as a photosensitive resistance material which is coated on a surface of a semiconductor, on the corresponding portion.

First, a first electrode 32' may be formed on a sample (or a nitride semiconductor) 28, which is desired to be oxidized, and put into an aqueous solution. The aqueous solution, for example, may be water (H20) or a PEC aqueous solution.

Also, a second electrode 32" for providing an electric potential difference to the sample 28 may be put into the solution in a separating manner from the first electrode 32'.

A power supply unit 34 for supplying power may be connected to an electric line connecting the two electrodes 32' and 32".

Afterwards, when a positive voltage is applied to the sample 28 and light is emitted to the sample 28 through a light source (or UV light source) 26, which generates light with energy corresponding to a bandgap of the p-GaN, the p-GaN layer 130 may be oxidized by the following chemical formula

   [Chemical Formula 1]

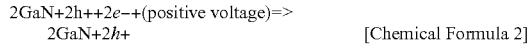   [Chemical Formula 2]

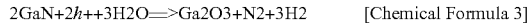   [Chemical Formula 3]

Also, the gate electrode 150, the source electrode 160 and the drain electrode 170 may be formed on the passivation layer 140 which has been formed using the PEC method, thereby completing the fabrication of an enhancement-type nitride heterojunction semiconductor device.

In addition to this, it may be obvious to a skilled person in the art that the passivation layer 140 can be formed by various PEC methods, and the present disclosure may not be limited to the PEC method illustrated in FIG. 4. The present disclosure may also employ PEC methods which have been modified, changed or improved within the scope of the present disclosure.

Description of a Fabricating Method for a Semiconductor Device in Accordance with One Exemplary Embodiment A method for fabricating a semiconductor device in accordance with one exemplary embodiment disclosed herein may be implemented by a combination of components or steps included in the aforementioned embodiments or by a combination of those embodiments. Hereinafter, redundant description will be omitted to clearly explain the method for fabricating the semiconductor device in accordance with the one exemplary embodiment disclosed herein.

A method for fabricating a semiconductor device in accordance with one exemplary embodiment disclosed herein may include forming a buffer layer on a substrate, forming a GaN layer on the buffer layer, forming an AlGaN layer on the GaN layer, forming a p-GaN layer on the AlGaN layer, forming a source electrode and a drain electrode, which are spaced from each other, on the AlGaN layer, which is open by etching a part of the p-GaN layer, forming a passivation layer by oxidizing the p-GaN layer, except for a partial region for forming a gate electrode thereon, and forming a gate electrode on the partial p-GaN region for forming the gate electrode.

A method for fabricating a semiconductor device in accordance with is another exemplary embodiment disclosed herein may include forming a buffer layer on a substrate, forming a GaN layer on the buffer layer, forming an AlGaN layer on the GaN layer, forming a p-GaN layer on the AlGaN layer, forming a passivation layer by oxidizing the p-GaN layer, except for a partial region for forming a gate electrode thereon, forming a source electrode and a drain electrode, which are spaced from each other, on the AlGaN layer, which is open by etching a part of the passivation layer, and forming a gate electrode on the partial p-GaN region for forming the gate electrode.

In accordance with one exemplary embodiment, the passivation layer may be formed by oxidizing the p-GaN layer based on a photoelectrochemical (PEC) method.

In accordance with one exemplary embodiment, the passivation layer may be made of GaOx, and x may range from 0.1 to 2.0.

In accordance with one exemplary embodiment, the p-GaN layer may be doped with a p-type dopant, and the p-type dopant may be at least one of Mg and Zn.

In accordance with one exemplary embodiment, a concentration of the p-type dopant may be in the range of 1e12/cm3 to 1e21/cm3.

In accordance with one exemplary embodiment, the p-GaN layer may have a thickness in the range of 1 nm to 1 um.

In accordance with one exemplary embodiment, at least one of the buffer layer, the GaN layer, the AlGaN layer, and the p-GaN layer may be formed based on at least one of MOCVD, MBE, HYPE, plasma-enhanced chemical vapor deposition (PECVD), sputtering and atomic layer deposition (ALD).

Figure 5:
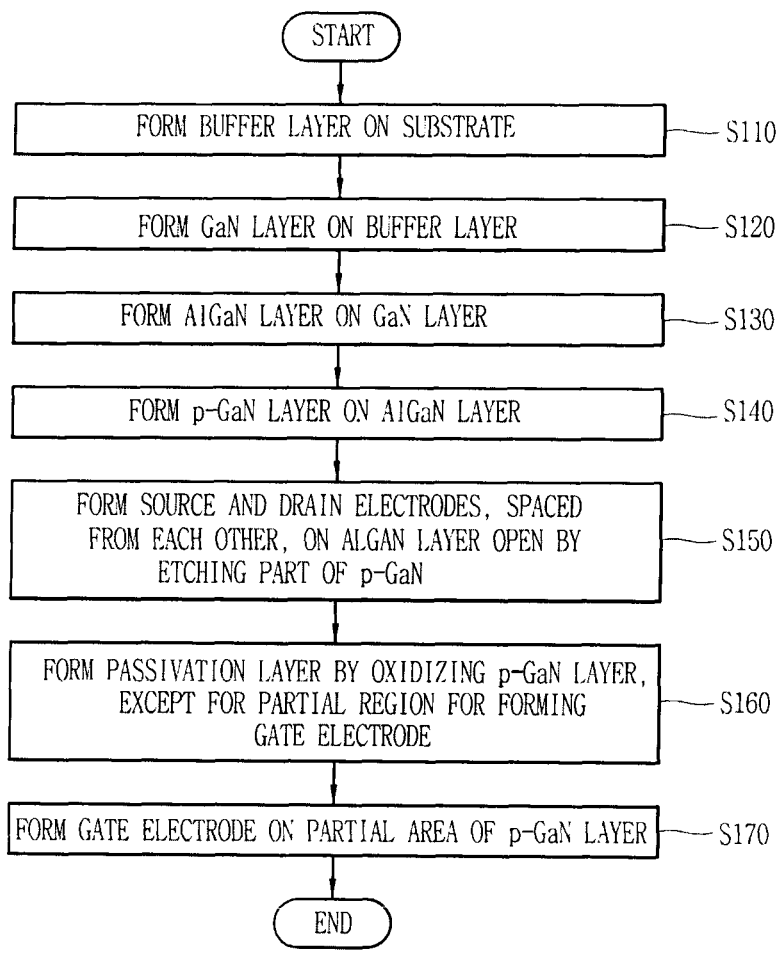
FIG. 5 is a flowchart illustrating a fabricating method for a semiconductor device in accordance with one exemplary embodiment disclosed herein.

FIG. 5 is a flowchart illustrating a fabricating method for a semiconductor device in accordance with one exemplary embodiment disclosed herein.

As illustrated in FIG. 5, a method for fabricating a semiconductor device in accordance with one exemplary embodiment may include the following steps.

First, a buffer layer may be formed on a substrate (S110).
A GaN layer may be formed on the buffer layer (S120).
An AlGaN layer may be formed on the GaN layer (S130).
A p-GaN layer may be formed on the AlGaN layer (S140).
A source electrode and a drain electrode, which are spaced from each other, may be formed on the AlGaN layer which has been open by etching a part of the p-GaN layer (S150).
A passivation layer may be formed in a manner of oxidizing the p-GaN layer, except for a partial p-GaN region for forming a gate electrode (S160).
A gate electrode may be formed on the partial p-GaN region of the p-GaN layer for forming the gate electrode (S170).

Figure 6:
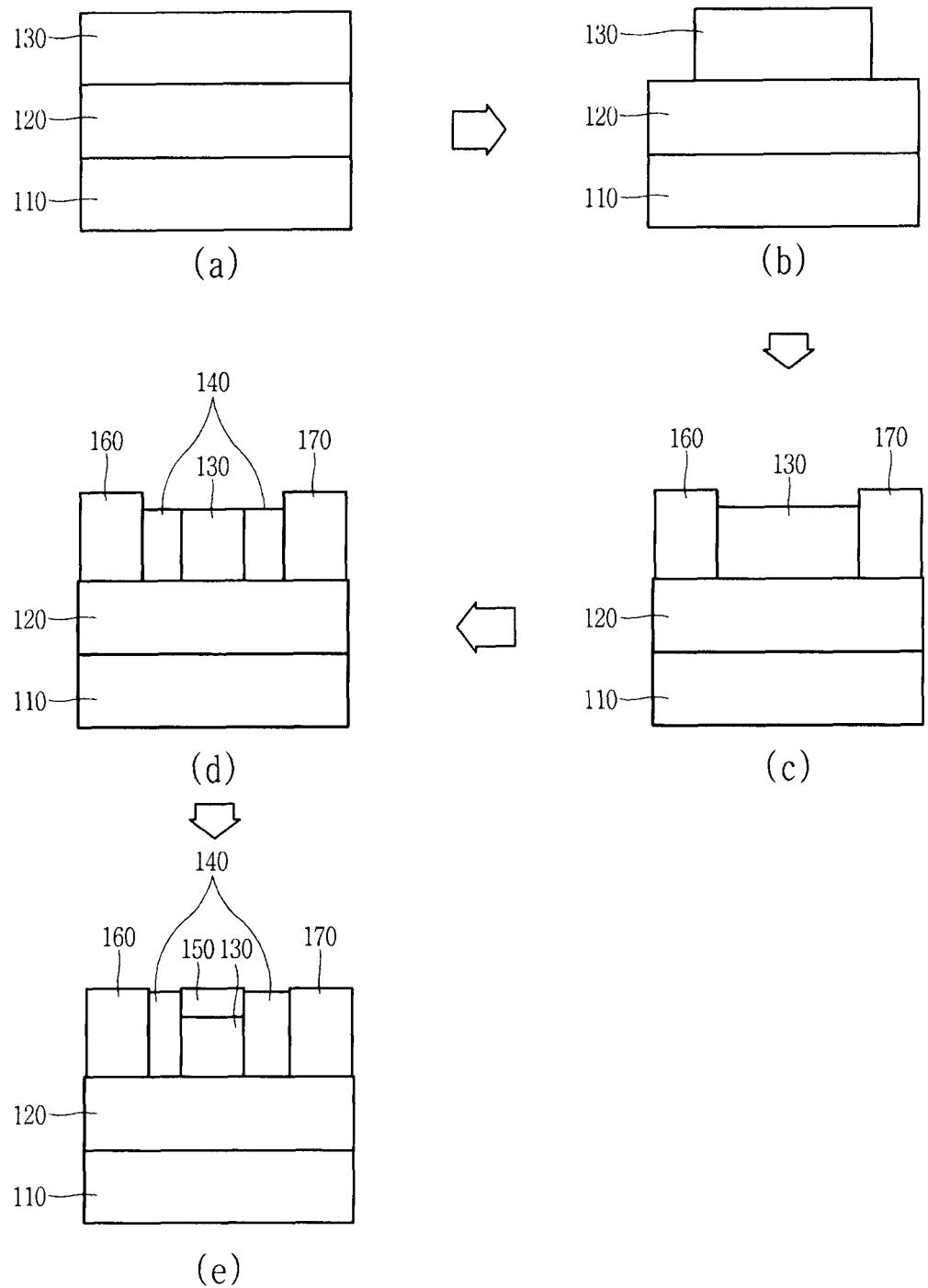
FIG. 6 is an exemplary view illustrating a fabricating method for a semiconductor device in accordance with one exemplary embodiment disclosed herein.

FIG. 6 is an exemplary view illustrating a fabricating method for a semiconductor device in accordance with one exemplary embodiment disclosed herein.

As illustrated in FIG. 6, the GaN layer 110, the AlGaN layer 120 and the p-GaN layer 130 may be formed in a sequential manner (see FIG. 6(*a*)), and thereafter a partial region of the p-GaN layer 130 may be selectively etched (see FIG. 6(*b*)).

The selective etched partial region of the p-GaN layer may be a region on which the source electrode 160 and the drain electrode 170 are formed.

That is, the source electrode 160 and the drain electrode 170, which are spaced from each other, may be formed on the AlGaN layer, which has been open by etching the partial region of the p-GaN layer 130 (see FIG. 6(*c*)).

Then, the passivation layer 140 may be formed by oxidizing the p-GaN layer 130, except for a partial p-GaN region for forming the gate electrode 150 thereon (see FIG. 6(*d*)).

Here, the passivation layer 140 may be formed by oxidizing the p-GaN layer 130 based on the PEC method.

The PEC method is similar to that illustrated in FIG. 4, so detailed description will be omitted.

Next, the gate electrode 150 may be formed (or deposited) on the partial region of the p-GaN layer 130 for forming the gate electrode thereon (see FIG. 6(*e*)).

Figure 7:
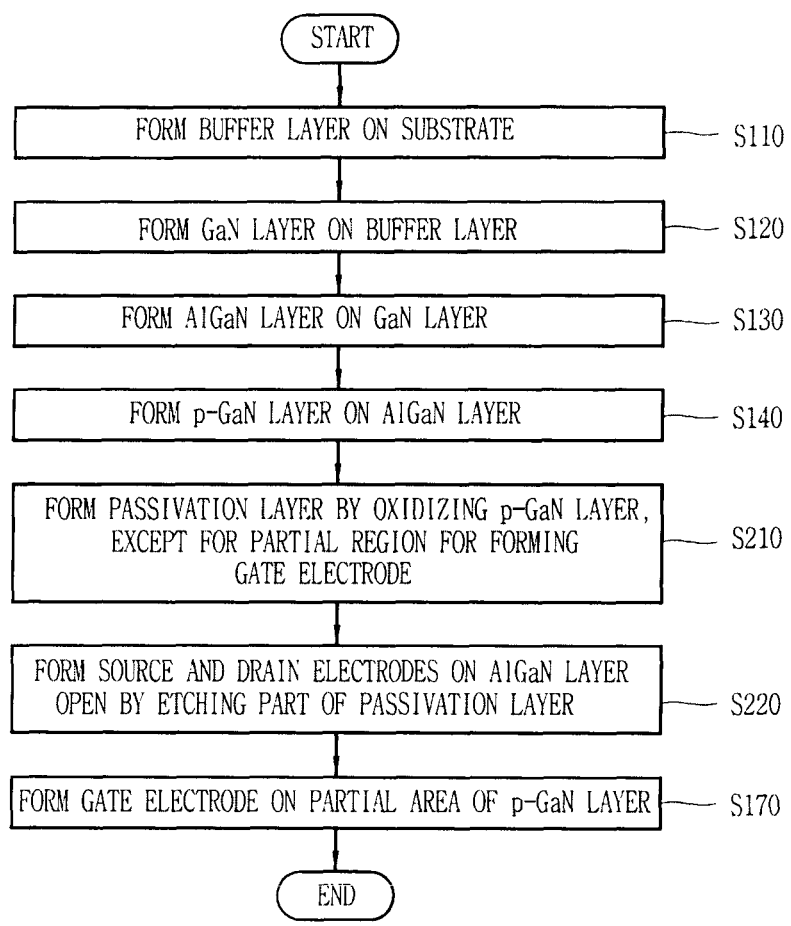
FIG. 7 is a flowchart illustrating a fabricating method for a semiconductor device in accordance with another exemplary embodiment disclosed herein.

FIG. 7 is a flowchart illustrating a fabricating method for a semiconductor device in accordance with another exemplary embodiment disclosed herein.

As illustrated in FIG. 7, a method for fabricating a semiconductor device in accordance with another exemplary embodiment disclosed herein may include the following steps.

First, a buffer layer may be formed on a substrate (S110).
A GaN layer may be formed on the buffer layer (S120).
An AlGaN layer may be formed on the GaN layer (S130).
A p-GaN layer may be formed on the AlGaN layer (S140).
Next, a passivation layer may be formed by oxidizing the p-GaN layer, except for a partial p-GaN region for forming a gate electrode thereon (S210).
A source electrode and a drain electrode, which are spaced from each other, may be formed on the AlGaN layer, which has been open by etching a part of the passivation layer (S220).
A gate electrode may be formed on the partial region of the p-GaN layer for forming the gate electrode thereon (S170).

Figure 8:
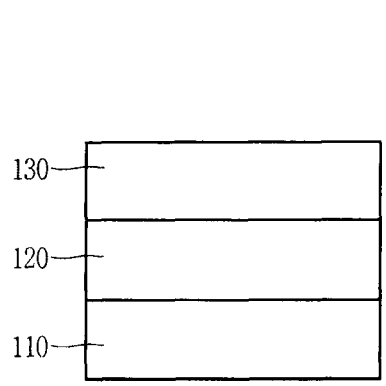
FIG. 8 is an exemplary view illustrating a fabricating method for a semiconductor device in accordance with another exemplary embodiment disclosed herein.
Figure 8:
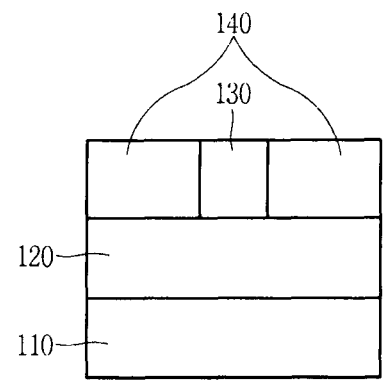
Figure 8:
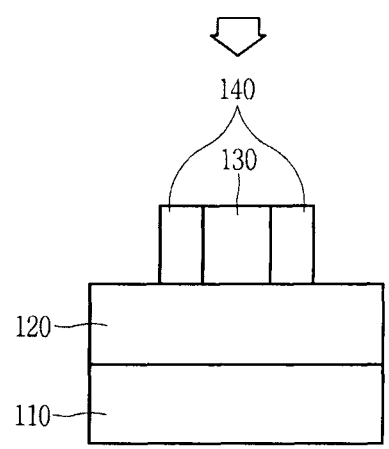
Figure 8:
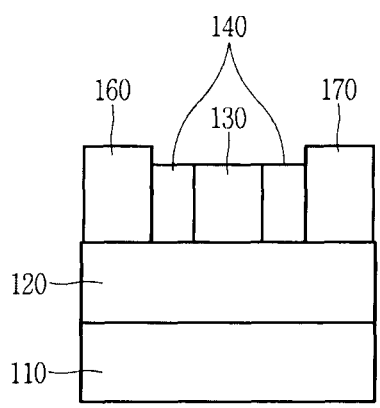
Figure 8:
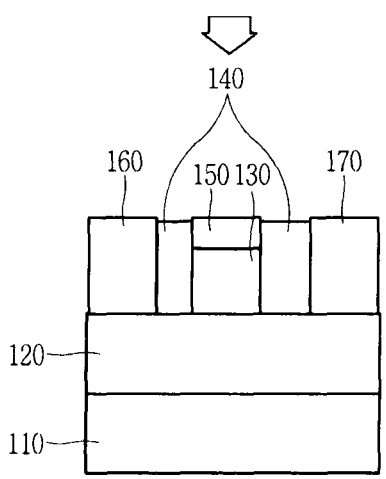

FIG. 8 is an exemplary view illustrating a fabricating method for a semiconductor device in accordance with another exemplary embodiment disclosed herein.

As illustrated in FIG. 8, the GaN layer 110, the AlGaN layer 120 and the p-GaN layer 130 may be formed in a sequential manner (see FIG. 8(a)), and thereafter the passivation layer 140 may be formed by oxidizing the p-GaN layer 130, except for a partial p-GaN region for forming a gate electrode thereon (see FIG. 8(b)).

Here, the passivation layer 140 may be formed by oxidizing the p-GaN layer 130 based on the PEC method.

The PEC method is similar to that illustrated in FIG. 4, so detailed description will be omitted.

The passivation layer 140 may be partially etched (See FIG. 8(c)).

Next, the source electrode 160 and the drain electrode 170, which are spaced from each other, may be formed on the AlGaN layer, which has been open through the partially etched passivation layer 140.

Next, the gate electrode 150 may be formed (or deposited) on the partial region of the p-GaN layer for forming the gate electrode thereon (see FIG. 8(e)).

As described above, in accordance with the one exemplary embodiment disclosed herein, an enhancement-type nitride semiconductor device having the passivation layer formed by the PEC method, and the fabricating method thereof may be provided.

Specifically, according to the semiconductor device disclosed herein, a normally-on state may be implemented based on the p-GaN layer. Here, the part of the p-GaN layer may be oxidized using the PEC method to form the passivation layer. This may result in providing a nitride semiconductor device which has the passivation layer of high quality and has an improved leakage current characteristic, and a fabricating method thereof.

In detail, the technology disclosed herein may be a technology of substituting the passivation layer for the p-GaN layer in a manner of oxidizing the p-GaN layer using the PEC method.

When light is emitted from a light source including light corresponding to a bandgap of the p-GaN and simultaneously an electrochemical reaction is generated, the p-GaN layer may be oxidized into GaOx (x=0.1~2.0).

The thusly-generated GaOx is an oxide layer with higher quality than a passivation layer which is deposited using a deposition device, and accordingly, quality of the passivation layer can be improved.

During the oxidization of the p-GaN, the p-GaN may gradually get thinner to be completely replaced with the GaOx. This may have an advantage in implementing an accurate etching of the p-GaN.

There may be two reasons therefor. First, the oxidization has an extremely slow oxidization speed, as compared with a generally used dry etching, which may facilitate for deciding a process condition.

Second, by considering the fact that the p-GaN layer and the AlGaN layer have different bandgaps from each other, when a light source corresponding only to the bandgap of the p-GaN layer selectively emits light, the AlGaN layer may not be oxidized. Therefore, only the p-GaN layer may be selectively oxidized. This may have an advantage in view of providing the same effect as selective etching of the p-GaN layer.

That is, the technology disclosed herein may provide effects of solving two problems, namely, an inaccurate etching of the p-GaN layer and low quality of the passivation layer.

In accordance with one exemplary embodiment disclosed herein, an enhancement-type nitride semiconductor device having the passivation layer formed by the PEC method, and the fabricating method thereof may be provided.

Specifically, according to the semiconductor device disclosed herein, a normally-on state may be implemented based on a p-GaN layer. Here, a part of the p-GaN layer may be oxidized using the PEC method to form the passivation layer. This may result in providing a nitride semiconductor device which has the passivation layer of high quality and has an improved leakage current characteristic, and a fabricating method thereof.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a semiconductor device, comprising:
   forming a buffer layer on a substrate;
   forming a Gallium Nitride (GaN) layer on the buffer layer;
   forming an Aluminum Gallium Nitride (AlGaN) layer on the GaN layer;
   forming a p-GaN layer on the AlGaN layer;
   etching portions of the p-GaN layer, wherein each portion of the p-GaN layer is spaced from each other;
   forming a source electrode and a drain electrode on a portion of the AlGaN layer corresponding to etched portions of the p-GaN layer;
   oxidizing the p-GaN layer, except for a partial region, for forming a passivation layer based on a photoelectrochemical (PEC); and forming a gate electrode on the partial region of the p-GaN layer that is not oxidized.

2. The method of claim 1, wherein the passivation layer is made of GaOx, and wherein x ranges from 0.1 to 2.0.

3. The method of claim 1, wherein the p-GaN layer is doped with a p-type dopant, and wherein the p-type dopant is at least one of Mg and Zn.

4. The method of claim 3, wherein the p-type dopant has a concentration in the range of 1e12/cm3~1e21/cm3.

5. The method of claim 1, wherein the p-GaN layer has a thickness in the range of 1 nm to 1 um.

6. The method of claim 1, wherein at least one of the buffer layer, the GaN layer, the AlGaN layer and the p-GaN layer is formed based on at least one of metal organic chemical vapor deposition (MOCVD), molecular beam epitaxy (MBE), hydride vapor phase epitaxy (HYPE), plasma-enhanced chemical vapor deposition (PECVD), sputtering, and atomic layer deposition (ALD).

* * * * *